United States Patent [19]

Nakayama et al.

[11] Patent Number: 4,924,807
[45] Date of Patent: May 15, 1990

[54] APPARATUS FOR CHEMICAL VAPOR DEPOSITION

[75] Inventors: Izumi Nakayama, Hiratsuka; Akitoshi Suzuki; Hiroyuki Nawa, both of Chigasaki; Motohiro Kaneko, Fujisawa; Yoshiro Kusumoto, Chigasaki; Kazuo Takakuwa, Chigasaki; Tetsuya Ikuta, Chigasaki, all of Japan

[73] Assignee: Nihon Shinku Gijutsu Kabushiki Kaisha, Kanagawa, Japan

[21] Appl. No.: 77,621

[22] Filed: Jul. 24, 1987

[30] Foreign Application Priority Data

Jul. 26, 1986 [JP] Japan ................. 61-176227
Jul. 26, 1986 [JP] Japan ................. 61-176228

[51] Int. Cl.$^5$ ................. C23C 16/46; C23C 16/52
[52] U.S. Cl. ................. 118/725; 118/50.1; 118/730
[58] Field of Search ................. 118/725, 50.1, 730

[56] References Cited

U.S. PATENT DOCUMENTS 3,939,798  2/1976  Morton ................. 118/725 X
4,496,609  1/1985  McNeilly et al. ................. 427/251 X
4,558,660  12/1985  Nishizawa et al. ................. 118/725
4,653,428  3/1987  Wilson et al. ................. 118/725

FOREIGN PATENT DOCUMENTS 59-67621  4/1984  Japan ................. 118/730

Primary Examiner—Evan Lawrence
Attorney, Agent, or Firm—Larson and Taylor

[57] ABSTRACT

An apparatus for a chemical vapor deposition in which at least one substrate which has partially an insulating film on the surface thereof is disposed in a pressure reduced reaction chamber, the reaction chamber is provided with a nozzle for feeding a reactive gas into the reaction chamber, and a light source is provided for emitting a light beam to heat the substrate. The apparatus has provision for feeding a second gas opposite the substrate to put the reactive gas in the vicinity of the substrate surface into laminar flow. The combination of substrate heating source using infrared rays and the laminarized jet of reactive gas is utilized for maintaining the selectivity, facilitating the thin film forming reaction, and obtaining improved high reproducibility and controllability.

28 Claims, 6 Drawing Sheets

APPARATUS FOR CHEMICAL VAPOR DEPOSITION

FIELD OF THE INVENTION

This invention relates to an apparatus for a chemical vapor deposition (CVD).

BACKGROUND OF THE INVENTION

In VLSI processes in which a high integration and a microfabrication are progressed, it has been positively prosecuted to establish effective mass productivity techniques as a concrete target for device production based on the design rule in submicron of 4M, 16M bit DRAM. In this connection, when metal wirings are formed on a substrate, it is necessary to solve the following three subjects:

(a) Reliable filling with metal film in a hole having high aspect ratio on the substrate;
(b) Formation of barrier metal;
(c) Establishment of a multilevel interconnection process based on a planarization technique.

To this end, various methods such as a bias sputtering, a selective growing of tungsten or etching-back method have been utilized. One of them, the selective growing of the tungsten is remarkably expected because it has a possibility of reliably forming and planarizing the metal film in the hole provided on the substrate, a barrier property of the tungsten itself and a high cost performance. It is known that the selective growing of the tungsten is one of chemical vapor deposition (CVD) methods in which a tungsten film is grown only on the Si surface or the metal surface surrounded by an insulating film such as $SiO_2$, PSG, BPSG or the like.

There is known a hot wall type CVD apparatus comprising a lateral vacuum reaction chamber, in which a reaction gas inlet is provided on one side wall of the reaction chamber for introducing mixture gas of a gas containing a metal element, $WF_6$, and a reducing gas, $H_2$ into the reaction chamber, a reaction gas outlet is provided on the other side wall of the reaction chamber for evacuating the mixture gas of $WF_6$ and $H_2$, a substrate supporting plate is horizontally disposed in the reaction chamber for supporting a plurality of substrates longitudinally at a predetermined interval, and a heating electric furnace is provided on the outer periphery of the reaction chamber.

In this conventional CVD apparatus, when the reaction chamber is heated by the heating electric furnace, the wall of the reaction chamber rises at its temperature, the eat on the chamber wall is transmitted to the mixture gas introduced through the reaction gas inlet, and then transmitted to the substrates. When the substrates are heated by means of this heat transferring, a chemical reaction of $WF_6$ and $H_2$ occurs on the surface of each substrate to form a thin film on the surface of each substrate.

A procedure for forming the thin metal film on the portion of the surface of the substrate using the conventional system will be described.

As shown in FIGS. 1 to 4 of the accompanying drawings, Si substrate "a" is used on the surface of which the thin insulating film "b" of $SiO_2$ is formed partially. Portions "c" of the substrate surface where no insulating film is formed is so-called contacting holes in each of which the thin metal film "d" is to be formed.

It is known that at the initial on the portions "c" chemical reaction occurs as follows:

$$WF_6 + 3/2 Si \rightarrow 3/2 SiF_4 + W \quad (1)$$

The thin metal film "d" is abruptly formed on the portions "c".

Then, it is considered that chemical reactions occur as follows:

$$3H_2 \rightarrow 6H \quad (2)$$

$$WF_6 + 6H \rightarrow 6HF + W \quad (3)$$

W is grown as time goes, and as shown in FIG. 3, the thin metal film "e" of W is formed on the surface of the thin metal film "d" of W initially formed.

In this case, the growth rate G of W is represented by the following:

$$G = (A)(H_2)^{\frac{1}{2}} \exp(-E_a/kT_m) \quad (4)$$

wherein A is positive constant, ($H_2$) is the concentration of hydrogen, k is Boltzmann's constant, and $T_m$ is the temperature at the surface of the portions on which the thin metal film is to be grown.

The temperature $T_m$ at the surface of the portions "c" becomes substantially equal to that at the surface of the thin insulating film "b". If the temperature $T_m$ at the surface of the portions "c" is raised, as understood from the equation (4), the growth rate of W is increased, but temperature at the surface of the thin insulating film also raises. Consequently, on the thin insulating film "b" the chemical reactions as represented by the formulae (2) and (3) may also be occurred and thus a thin metal film "f" of W may be formed on the surface of the thin insulating film "b" as shown in FIG. 3.

In FIG. 4 there is shown in an enlarged version a part of the substrate shown in FIG. 3. It will be seen that, in the procedure of growing the thin metal film "e", there is occurred an encroachment phenomenon in which a metal element may be invaded into a boundary zone between the substrate "a" and the thin insulating film "b". As the case may be, voids "h" may be produced in the substrate "a". Such encroachment is denoted by reference "g".

According to the conventional method, the turbulent flow or the natural convection occurs near the substrate "a". The inventors have presumed that the turbulent flow or the natural convection accelerates the growth of the above-described encroachment or the voids.

However, the feed or stream of the gas is controlled only by two internal parameters such as pressure and reactive gas flow rate. Thus, it is impossible to externally control the gas flow so as to suppress the disturbance and the natural convection of the reactive gas which may be occurred in the reaction chamber. Therefore, thin films cannot be formed with excellent reproducibility, controllability and uniformity in wide pressure and flow rate ranges. Furthermore, since the reaction components are diffused in the entire area in the reaction chamber, it is not possible to avoid an adhesion of the diffused reaction components to the reaction chamber walls and an inspection window provided thereon. Therefore, the generation of dusts, the mixture of impurities in the thin film to be formed due to the adhesion of the diffused reaction components to the reaction chamber walls and the inspection window cannot be avoided.

To suppress such encroachment and the formation of the voids, a low temperature, low concentration growth has been developed. However, in this method, the growth rate which may be obtained is merely several 10 Angstroms/min. (see, by Broadbent et al. J. Electrochem. Soc. 131. (42) 1984; Blewer. VMIC 1985). For example, it takes approximately 2 hours to fulfill the contact holes of 1 micron depth.

In the conventional method, the growth of the W nucleus on the insulating film, that is, the selectivity loss may be easily occurred. To avoid this selectivity loss, it is necessary to see the growth rate of the W film at lower level or to decrease the thickness of the W film to be formed.

This invention is to utilize the combination of substrate heating source using infrared rays and a laminarized jet of reactive gas for purpose of maintaining the selectivity, facilitating the thin film forming reaction, and improving the high reproducibility and controllability.

The laminarized jet of the reactive gas has merits as follows:

(a) It is possible to coincide the gas flow control with a simulation;

(b) The diffusion of the reaction gas and reaction product to reaction chamber walls can be suppressed by uniformly and locally feeding the reaction gas to the vicinity of the substrate.

This invention has an object to provide a CVD apparatus which eliminates the disadvantages of the above-mentioned conventional chemical vapor depositions, and can form a thin metal film only on a portion not formed with a thin insulating film in the surface of a substrate on which the insulating film is partially formed at increased growth rate while suppressing the encroachment and the growth of the voids.

Another object of the invention is to provide an apparatus for a chemical vapor deposition in which a thin metal film can be formed with good reproducibility, controllability and uniformity.

SUMMARY OF THE INVENTION

According to one aspect of this invention, there is provided an apparatus for a chemical vapor deposition, comprising a pressure reduced reaction chamber in which at least one substrate is disposed, means for feeding a reactive gas into said reaction chamber, and means for emitting a light beam to heat said substrate in said reaction chamber, thereby producing a chemical reaction to form a thin film on said substrate.

According to a second aspect of this invention, there is provided an apparatus for a chemical vapor deposition, comprising a pressure reduced reaction chamber, means for feeding a reactive gas into said reaction chamber, means for holding at least one substrate in said reaction chamber and having means for heating said substrate, and means for emitting a light beam to heat said substrate in said reaction chamber, thereby producing a chemical reaction to form a thin film on said substrate.

According to a third aspect of this invention, there is provided an apparatus for a chemical vapor deposition, comprising a pressure reduced reaction chamber in which at least one substrate is disposed, means for feeding a first gas substantially parallel to the surface of said substrate under reduced pressure in a sheet-like flow, means for feeding a second gas opposite to the surface of said substrate to put said first gas flow into a laminar flow state in the vicinity of said substrate, and means for emitting a light beam to heat said substrate in said reaction chamber, thereby producing a chemical reaction to form a thin film having the component of said first gas on said substrate.

According to a fourth aspect of this invention, there is provided an apparatus for a chemical vapor deposition, comprising a pressure reduced reaction chamber; means for supporting at least one substrate in said reaction chamber and having means for heating said substrate, means for feeding a first gas substantially parallel to the surface of said substrate under reduced pressure in a sheet-like flow, means for feeding a second gas opposite to the surface of said substrate to put said first gas flow into a laminar flow state in the vicinity of said substrate, and means for emitting a light beam to heat said substrate in said reaction chamber, thereby producing a chemical reaction to form a thin film having the component of said first gas on said substrate.

Each substrate may be provided with an electrical insulating film on a portion of the surface thereof and with no electrical insulating film on the other portion of the surface thereof with a first metal film.

The substrate may be irradiated by the light beam, for example, an infrared ray to create a temperature difference between the electrical insulating film and the first metal film by the difference in a light absorptivity of the body of the substrate, the electrical insulating film and the first metal film.

The gas containing the metal element may be any one or more in combination selected from metallic halides such as $WF_6$, $MoF_6$, $TaF_5$, $CrF_4$, $TiF_4$, $TiCl_4$, $MoCl_5$, $WCl_6$, $AlCl_3$ and the like.

The electrical insulating film provided on the surface of the substrate may be formed of any one or more selected from oxides such as $SiO_2$, $Al_2O_3$, BSG, PSG, BPSG and the like, nitrides such as BN, $SiN_x$ and the like, and compound such as $SiN_xO_y$.

The first metal film may be formed of any one or more selected from metals such as W, Mo, Ta, Cr, Ti, Al, Pt, Pd, Au, Ni and the like or their alloys.

The first metal film may be formed of any one or more selected from metallic silicides such as $WSi_x$, $TiSi_x$, $TaSi_x$, $MoSi_x$, $PtSi_x$ and the like, and metallic nitrides such as TiN or the like.

The each substrate may be made of any one of Si, $SiO_2$, $Al_2O_3$, glass, sapphire or the like, or may be formed of a thin film of Si on the uppermost layer thereof.

In this invention, the flows of the gas containing the metal element and the reducing gas can be maintained in a laminar flow state with good controllability in the entire area of the vicinity of the substrate. The flow of the inert gas or the gas which contains the inert gas as a main component can dynamically suppress the soaring or blowup of the gas containing the metal element and the reducing gas and can prevent the components of the gas containing the metal element from diffusing by turbulent.

According to this invention, therefore, the encroachment and the formation of the voids can be effectively suppressed to provide excellent controllability and reproducibility of the thin metal films to be formed on the substrate, the second thin metal film can be formed only on the first thin metal film previously formed at high speed, and the reaction chamber wall and the transparent window can be prevented from contaminating.

These and other objects, features, and advantages of this invention will become apparent from a study of the following description in which reference is directed to the accompanying drawings.

DETAILED DESCRIPTION OF THE INVENTION

Figure 1:
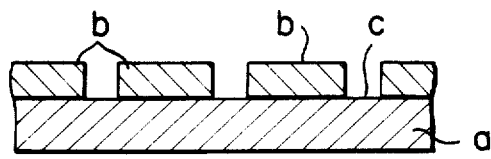
FIGS. 1 to 4 are sectional views of a procedure for forming a thin metal film on the contact holes provided on the surface of a Si substrate according to the conventional system, respectively.
Figure 2:
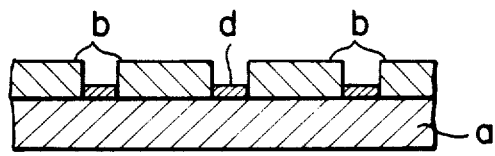
Figure 3:
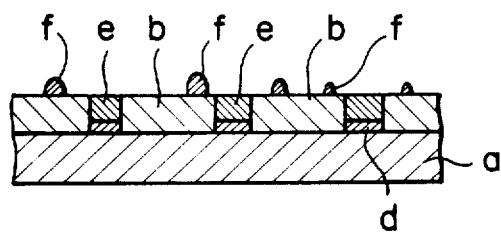

Reference is now made to FIGS. 5 to 8 which schematically show an apparatus designed to carry out the improved chemical vapor deposition procedure of this invention. In the illustrated apparatus, reference numeral 1 denotes the reaction chamber in which the pressure is reduced. In the reaction chamber 1, there is disposed a rotatable substrate holder 2 for supporting one or more substrates 3 on which the desired thin film is to be formed. The substrate holder 2 is intended to be rotated by a suitable driving motor (not shown) provided on the outside of the chamber 1 at a predetermined RPM. The reaction chamber 1 has a wall portion 1a provided with two gas inlets 4a and 4b, each of which has a slitlike opening. The gas inlets 4a and 4b are connected to separated reactive gas sources (not shown), respectively. One 4a of the gas inlets is intended to feed the reducing gas, $H_2$, in a sheet-like state substantially parallel to the surface of each substrate 3 into the reaction chamber 1, while the other gas inlet 4b is intended to feed the gas containing the metal element, $WF_6$, in a sheet-like state substantially parallel to the surface of each substrate 3 into the reaction chamber 1. The $H_2$ and $WF_6$ gases thus fed through the gas inlets into the reaction chamber 1 are intended to flow along the surface of the substrate 3 in the reaction chamber 1.

The reaction chamber 1 has an upper wall portion provided with a transparent window 5 which may be made of quartz glass and an inert gas inlet 6. The inert gas inlet 6 comprises a gas injection member 6a which is formed of a transparent quartz glass provided with a plurality of openings 6b.

This gas injection member 6a is disposed under the transparent window 5 so that an inert gas passage 6c is formed therebetween. The inert gas such as Ar may be downwardly from the gas injection member 6a into the reaction chamber 1. The flow of the Ar gas injected downward into the reaction chamber 1 is intended to cross substantially perpendicularly to the flows of the $WF_6$ and $H_2$ gases fed through the gas inlets 4a and 4b so as to prevent the $H_2$ and $WF_6$ gases from upwardly penetrating.

The reaction chamber 1 has a bottom wall portion 1c provided with an exhaust port 7 for evacuating the $H_2$ and $WF_6$ gases from the reaction chamber 1. The port 7 is connected to a suitable vacuum pump system (not shown).

Disposed outside the reaction chamber 1 above the upper wall portion 1b thereof are infrared lamps 8 from which the light beam is irradiated through the quartz glass window 5 and the gas injection member 6a to the surface of the substrate 3 on the substrate holder 2, thereby heating the substrate 3 at a predetermined temperature. The operation of each lamp 8 is controlled by a control device 9 so that the temperature at the specific position in the reaction chamber 1 may be maintained at a predetermined level.

For purposes of clarity of illustration, it will be understood that only those portions of the reactor system necessary to illustrate the inventive concepts disclosed herein have been shown in the drawings.

The operation of the illustrated apparatus will be described with reference to FIGS. 6 to 8.

The reducing gas $H_2$ is injected in a 2-dimensional jet-like flow as shown by arrows R through the gas inlet or nozzle 4a into a space A defined on the substrate 3. The reactive gas $WF_6$ is similarly injected in a 2-dimensional jet-like flow as shown by arrows R' through the gas inlet or nozzle 4b into the space A. On the other hand, through the inert gas inlet 6 the Ar gas is injected downward into the reaction chamber 1 as shown by arrow Q. The flow rates of the gases to be injected can be externally controlled and, for example, it may be controlled that the flow rate of the inert gas flow Q becomes three times that of the reactive gas flows R and R'.

Figure 6:
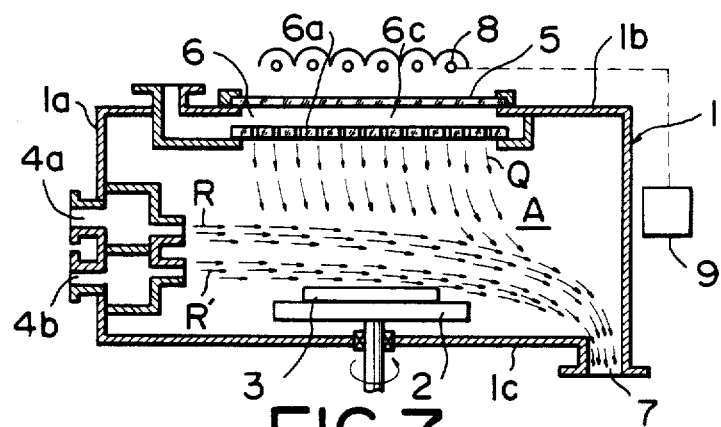
FIGS. 6, 7 and 8 are sectional views similar to that of FIG. 5 to illustrate the condition of different gas flows in the apparatus shown in FIG. 5, respectively.

As shown in FIG. 6, the gas flows R and R' are limited to the vicinity of the substrate 3 on the substrate holder 2 and to be in laminar flow condition. It will be considered that this is because the downward flow Q of the inert gas from the inert gas inlet 6 restrains the gas flows R and R' of the reactive gases from the gas inlets 4a and 4b from above. This restraining action, that is, the stabilizing action of the downward flow Q of the inert gas may be confirmed by a numerical simulation using a computer or by a visualization technique using titanium tetrachloride. When the gas flows R, R' and Q are observed in the entirety, as shown in FIG. 7, the gas flows R and R' (as hatched) become a localized laminar flow the range of which is determined by the inert gas flow Q. In other words, the shape, the extent or the range of the hatched portion can be controlled by adjusting the flow rate of the gas flow Q.

Figure 8:
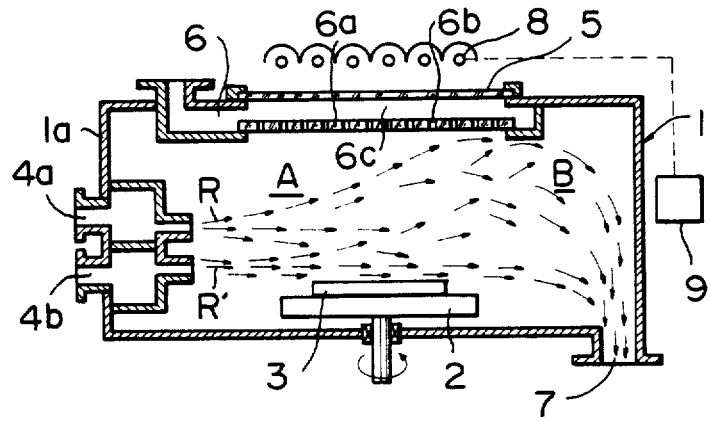

If no downward gas flow Q of the inert gas is given to the gas flows R and R', as shown in FIG. 8, these gas flows R and R' are diffused so as to become turbulent flows in the area B of the space A. In this case, the walls of the reaction chamber 1, the transparent window through which the heating light beam is transmitted and the inspection window (not shown) provided on the chamber 1 are contaminated by the diffused reactive gas components, as in the conventional system.

Figure 7:
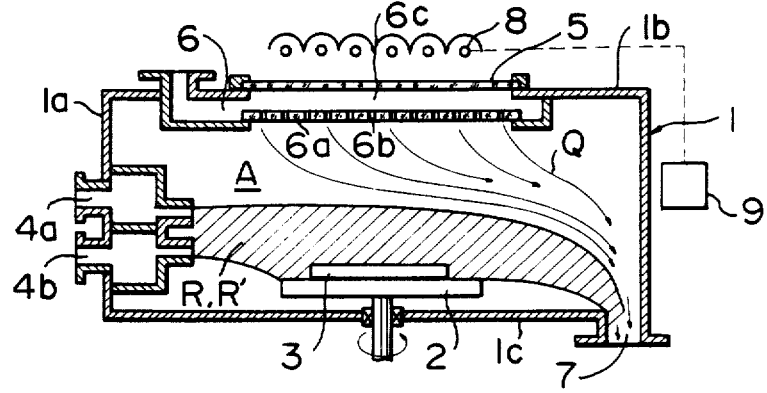

According to this invention, however, the gas flows R and R' are positively stabilized as shown in FIGS. 6 or 7, the reaction components are limited only to the vicinity of the substrate 3 on the substrate holder 2 to prevent the chamber walls and the transparent wall portion from contaminating. Therefore, the quality of the metal film to be formed on the substrate 3 can be improved, and the dust particles in the reaction chamber can be reduced.

Figure 9:
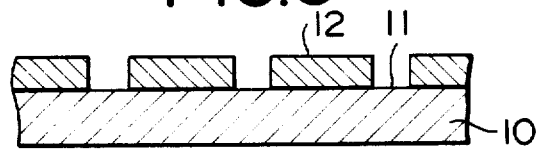
FIGS. 9 to 11 are sectional views showing a procedure for forming a thin metal film on the contact holes provided on the surface of a Si substrate according to this invention, respectively.
Figure 10:
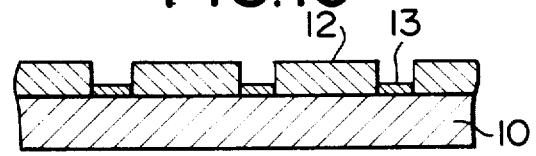
Figure 11:
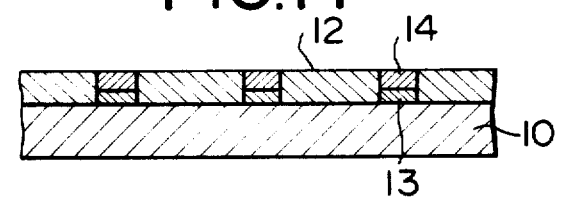

In FIGS. 9 to 11, there is shown how the thin film containing the metal element is formed on Si substrate 10 by using the apparatus illustrated in FIG. 1 in accordance with this invention.

By the control device 9, the lamps 8 can be controlled to maintain the specific area in the reaction chamber 1 at a predetermined temperature. By feeding the $H_2$, $WF_6$ and Ar gases into the reaction chamber 1 which is under reduced pressure through the gas inlets 4a, 4b and 6, respectively, and irradiating the light beam having a wavelength of 1.1-3 micron for the maximum intensity from the lamps 8 to the surface of the substrate 10 which is rotated in the reaction chamber 1 through the transparent window 5 and the transparent gas injection member 6a, it will be considered that a chemical reaction occurs at the initial on the portions 11 of the surface of the substrate 10 where the thin insulating film 12 is formed as follows:

$$WF_6 + 3/2Si \rightarrow 3/2SiF_4 + W \qquad (5)$$

On the portions 11 of the substrate 10 the first thin metal film 13 is to be grown, as shown in FIG. 10. It should be understood that this chemical reaction is automatically stopped when the thin metal film 13 is formed on the portions 11 of the surface of the substrate 10 on which the thin insulating film 12 is not formed, and then the thin metal film 13 of W has a thickness of 1000 angstroms or less.

It is known that the Si substrate has very small absorptivity for an infrared ray having a wavelength longer than or equal to 1.1 micron, while the thin insulating film of $SiO_2$ has very small absorptivity for an infrared ray having a wavelength shorter than or equal to 3 micron, and the thin metal film of W has larger absorptivity than that of the Si substrate or the thin insulating film of $SiO_2$ in the entire wavelength range of 1.1-3 micron. Thus, the thin metal film 13 of W is heated at higher temperature than the thin insulating film 12 of $SiO_2$, so that there is obtained a difference in temperature between the thin metal film 13 and the insulating film 12.

Therefore, it will also be considered that on the surface of the thin metal film 13 chemical reactions occur as follows:

$$3H_2 \rightarrow 6H \qquad (6)$$

$$WF_6 + 6H \rightarrow 6HF + W \qquad (7)$$

W is grown as time goes, and the thin metal film 14 of W corresponding to the second thin metal film is formed on the surface of the thin metal film 13 of W corresponding to the first thin metal film as shown in FIG. 11.

Figure 12:
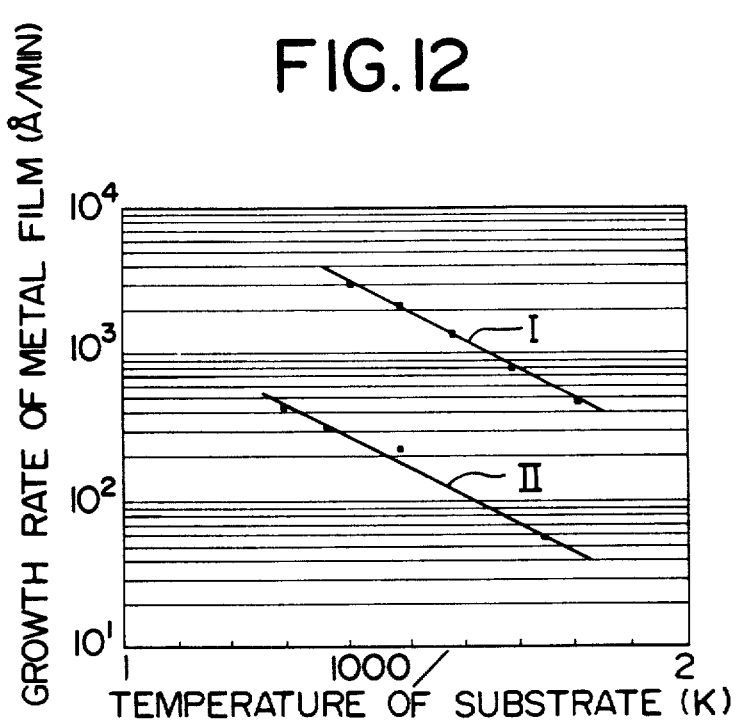
FIG. 12 is a graph showing the compared data in growth rates of the thin metal film of W in this invention and the conventional system.

According to the embodiment described above, since the thin metal film 13 of W is formed on the portion 11, not formed with the thin insulating film 12 on the surface of the substrate 10 at the initial time and then temperature difference occurs by the irradiation of the infrared ray from the lamps 8 between the thin metal film 13 of W and the thin insulating film 12 of $SiO_2$ so that chemical reaction is created only on the surface of the thin metal film 13 of W. Therefore, the thin metal films of W can be formed only on the portion 11, not formed with the thin insulating film 12 on the surface of the substrate 10. As shown in FIG. 12, the growth rate of the metal film (reference character I) becomes higher than the growth rate (reference character II) according to the conventional method. In FIG. 12, an abscissa axis is 1000/temperature of substrate (K) and an ordinate axis is growth rate (Angstrom/min) of the thin metal film of W.

Figure 4:
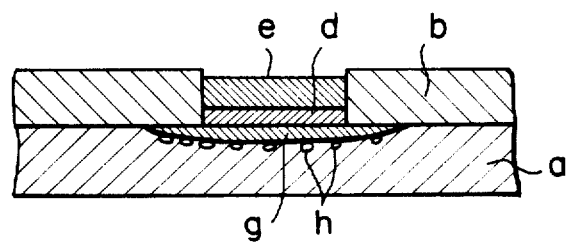

As shown in FIG. 11, the thin metal film 14 of W corresponding to the second thin metal film is formed on the thin metal film 13 of W, and the yield of manufacturing an element can be improved by suppressing the encroachment and the growth of the voids as shown in FIG. 4.

Since the flows of the gases R, R' are in a laminar flow, excellent controllability and reproducibility are provided, and the thickness uniformity of the metal film 14, the second metal film formed on the surface of the first thin metal film as well as the depth of the encroachment can be controlled by controlling the flow rate of the inert gas Q.

The theoretical foundation of the advantages according to the gas flowing system of this embodiment will be simply described.

Unclear points are still existed for the operations as to the influence of the flowing state of the reaction gas on the encroachment phenomenon, but it is possible to establish the following working assumption. Remarkable encroachment is a silicon reducing reaction which originally should automatically stop by coating the silicon surface wit the thin metal film, i.e., a phenomenon that the reaction represented by the following formula continues even after the initial time of the reaction.

$$WF_6 + 3/2.Si \rightarrow W + 3/2.SiF_4 \uparrow \qquad (8)$$

In this case, it is considered that the reaction gas is supplied through a gap between the thin metal films and the side wall of the insulating film, and ultrafine gaps among crystal grain boundaries in the thin metal film. In order that the silicon reduction continuously advances in the boundary between the thin metal film and the silicon, reactive products ($SiF_4$ in the above reaction formula) must be effectively exhausted to the space. If a turbulent flow exists in the vicinity of the surface of the substrate, the reactive product is rapidly diffused and exhausted through the gaps by pumping action of turbulent flowing diffusion. However, when the surface is coated entirely with the laminar flow of the reactive gas, the exhaust of the reactive product must be by molecular diffusion, which is so delay as to be ignored for the turbulent flow diffusion if the gaps are sufficiently narrow. It will be understood the fact that the gas flow control near the surface of the substrate largely contributes to the encroachment phenomenon by the abovementioned assumption.

In this embodiment, under the same growing temperature, total pressure and reaction gas partial pressure, comparison experiments of the case that the control of the gas flows R, R' by the inert gas flow Q was performed with the case that the control of the gas flows R, R' was not performed were conducted. The reactive gas employed the tungsten hexafluoride ($WF_6$) and the hydrogen $H_2$ similarly to the above description, the inert gas employed argon Ar, the growing temperature was 400° C., the total pressure was approx. 0.7 Torr. By the observation of the section by the electron microscope when the tungsten (W) film was accumulated approx. 7000 Angstroms in the contacting hole, it was confirmed that the lateral and vertical invasion lengths in the case that the inert gas flow Q was not used were 3200 and 8000 Angstroms or more, respectively, and in the case that the inert gas flow was used were 400 and 800 Angstroms or less. It is also confirmed that the encroachment suppressing effect according to the gas flow controlling action acts as independent parameters from the growing temperature and the pressure under various conditions of a wide range.

Figure 13:
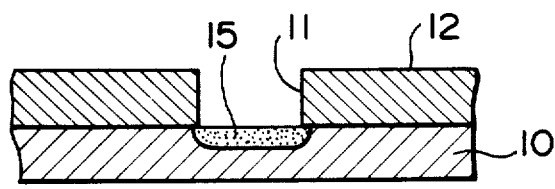
FIGS. 13 and 14 are sectional views showing structures of different substrates to which this invention may be applied, respectively.
Figure 14:
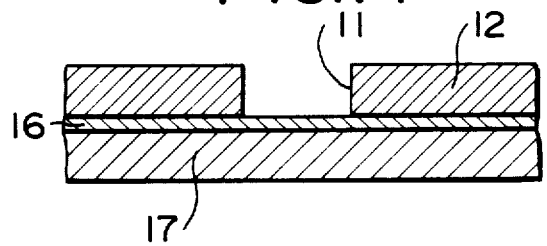

In the embodiment described above, $H_2$ has been used as the reducing gas $WF_6$ has been used as the gas containing a metal element. However, this invention is not limited to the particular example. Any of reducing gases and gases containing a metal element may be employed. For example, it may include $MoF_6$, $TaF_5$, $CrF_4$, $TiF_4$, $TiCl_4$, $MoCl_5$, $WCl_6$, or $AlCl_3$. $SiO_2$ has been used as the thin insulating film. However, this invention is not limited to the particular exmaple. For example, it may include oxides such as $Al_2O_3$, BSG (Borosilicate glass), PSG (Phosphosilicate glass), BPSG (Borophosphosilicate glass), nitrides of BN, $SiN_x$, or compound of $SiN_xO_y$ (where, x and y are numerical values). Further, the thin metal film of W has been used as corresponding to the first and second thin metal films. However, this invention is not limited to the particular exmaples. For example, the first and second thin metal films may include metals Mo, Ta, Cr, Ti, or Al, or their alloy, or alloy of W. Si has been used for the substrate. However, this invention is not limited to the particular exmaple. For example, as shown in FIG. 13, the substrate in which any of elements 15 belonging to the III or V group of the Periodic Table is ion implanted to a part of the surface of the Si substrate 10 and at least Si element is exposed on the portion 11 on which the thin insulating film 12 is not formed on the surface of the Si substrate 10, may be employed. Any structure and quality of material may be employed as the substrate if the Si thin film is formed on the uppermost layer of the substrate. For example, as shown in FIG. 14, a thin Si film 16 may be formed on the surface of a sapphire 17. Further, when the thin metal film of W corresponding to the first thin metal film is grown, Si element exposed on the surface of the substrate may be diffused previously in the thin metal film of W. Even when the thin metal film of metals Mo, Ta, Cr, Ti or Al, or their alloy or alloy of W corresponding to the first thin metal film is grown, the Si element exposed previously on the surface of the substrate may be diffused in the thin metal film of W. The wavelength for producing the maximum intensity of the infrared lamp 8 is set to 1.1 to 3 microns. This invention is not, however, limited to this. For example, the wavelength may be set to any of 0.75 to 5 microns.

Figure 5:
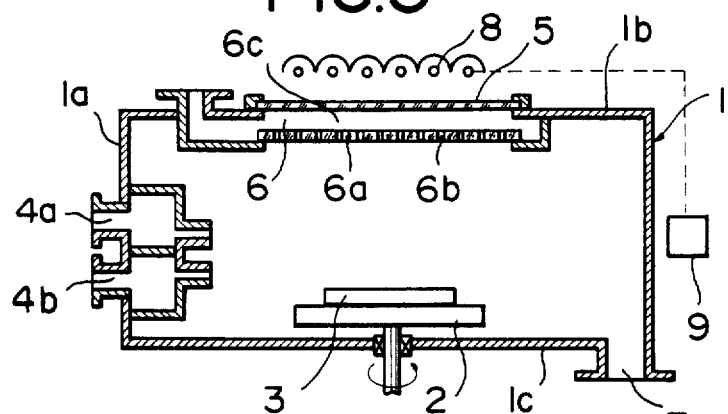
FIG. 5 is a schematic sectional view of an apparatus according to an embodiment of this invention.
Figure 15:
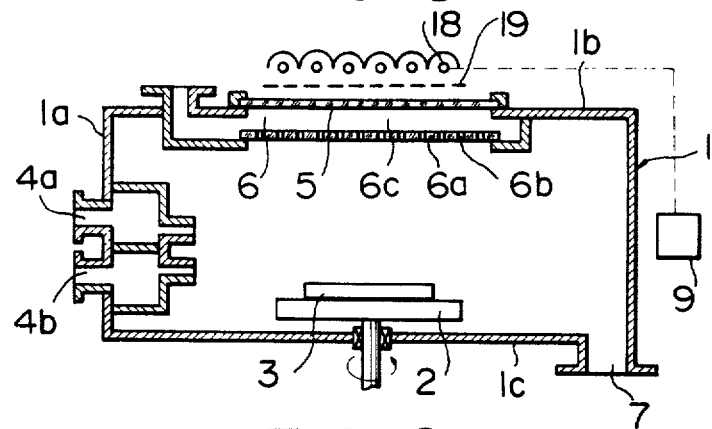
FIG. 15 is a schematic sectional view showing a modified apparatus according to this invention.

In FIG. 15, there is shown a modification of the apparatus shown in FIG. 5, in which heating lamps 18 are used instead of the infrared lamps 8, and an optical filter 19 is provided between the heating lamps 18 and the transparent window 5 in the upper wall portion 1b of the reaction chamber to set the wavelength of the light beam from the heating lamps 18 for the maximum intensity, for example, to 0.75-5 microns. The components corresponding to those in the apparatus of FIG. 1 are designated by the same or equivalent reference numerals.

Figure 16:
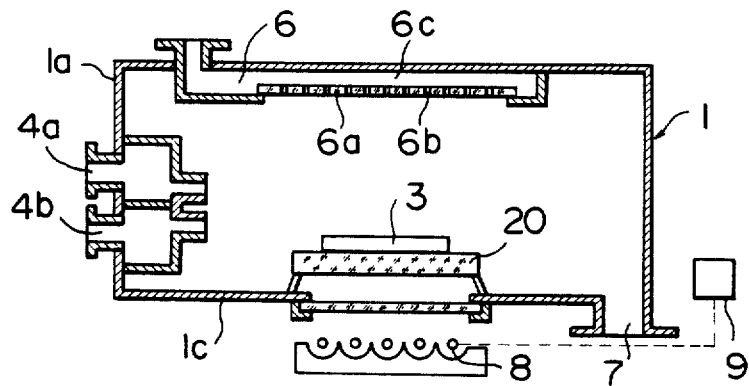
FIG. 16 is a schematic sectional view showing another modification of the apparatus.
Figure 17:
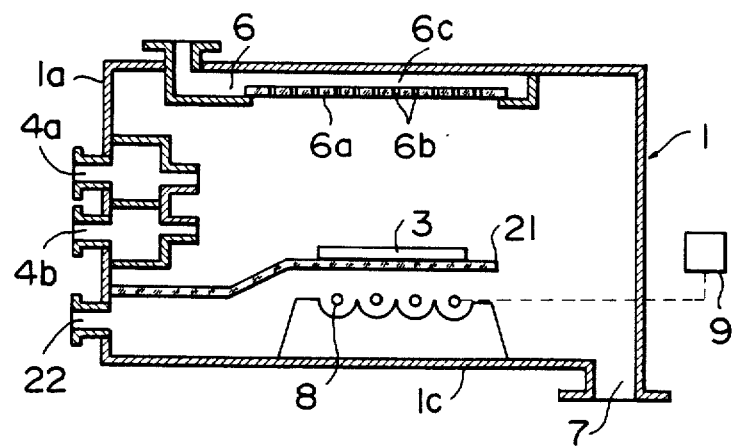
FIG. 17 is a schematic sectional view showing a further modification of the apparatus.

FIGS. 16 and 17 show another modifications of the apparatus of FIG. 5, in which the irradiation of the light beam is made on the back surface of the substrate 3. In FIGS. 16 and 17, substrate holders 20 and 21 are formed of a transparent material such as quartz. With the arrangement shown in FIG. 17, there is provided a second inert gas inlet 22 through which an inert gas is introduced into the space defined between the lamps 8 disposed in the reaction chamber 1 and the substrate holder 21 to prevent the reactive product from being adhered to the heating lamps 8 and the transparent holder 21. Alternatively, the lamps 8 may be disposed in the substrate holder 20 or 21.

Figure 18:
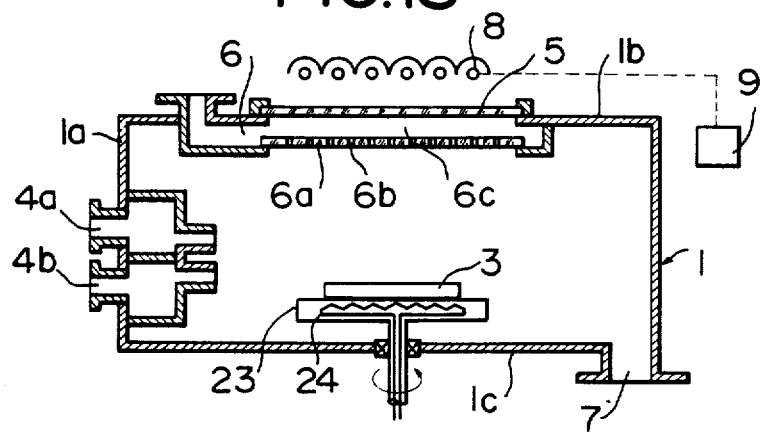
FIG. 18 is a schematic sectional view showing a further modification of the apparatus.

In a further modification of the apparatus shown in FIG. 18, a rotatable substrate holder 23 is provided with heating means 24. The components corresponding to those in the apparatus of FIG. 5 are designated by the same or equivalent reference numerals.

In the arrangements of FIG. 5, 15 and 18, the substrate is rotated, but the substrate may not be rotated as shown in FIGS. 16 and 17.

Figure 19:
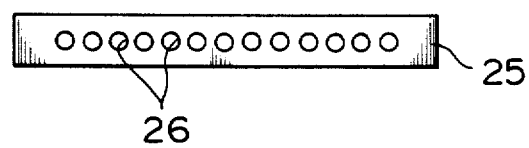
FIGS. 19 and 20 are schematic front views of different gas injecting nozzles which may be used in the apparatus, respectively.
Figure 20:
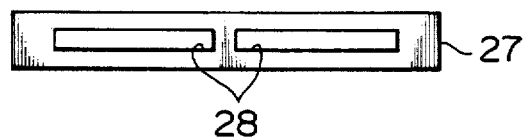

In FIGS. 19 and 20, there are shown different gas injecting nozzles which may be used for injecting the reactive gases into the reaction chamber. The nozzle shown in FIG. 19 comprises a flat hollow conduit 25 formed with a number of small openings 26 in the end wall thereof, the openings 26 being arranged in a line. The nozzle of FIG. 20 comprises a flat hollow conduit 27 in the end wall of which two slits 28 are formed, these slits 28 being aligned laterally.

In the embodiments described above, the gas which is fed opposite to the surface of the substrate is the inert gas. However, a gas containing partly a reactive gas may be used. In this case, the contained reactive gas is necessarily of the type which does not produce dust particles. For example, $H_2$, $N_2$, $O_2$ or the like may be contained.

In the embodiments described above, the inert gas injecting unit having the openings has been employed. However, a strainer or a honeycomb having suitable aspect ratio may be employed insteads. Or, this and the unit having openings may be employed together.

In the embodiments described above, the inlet unit 4a for $H_2$ and the inlet unit 4b for $WF_6$ are separately provided. However, they may be combined to one, or the mixture gas may be fed into the reaction chamber 1.

In the foregoing description, the growth of the thin metal film of the case that the thin insulating film is formed on part of the surface of the substrate and is not formed on the other portion has been explained. However, this invention is not limited to such substrate, and can be applied to the substrate that the thin insulating film is formed on part of the surface and the first thin metal film has been already formed on the other portion of the surface.

In this case, the substrate 10 as shown in FIG. 10 may be manufactured by other apparatus, and this may be disposed in the apparatus in FIG. 5 according to the embodiment of this invention. This invention can be applied to the substrate as shown in FIG. 21.

Figure 21:
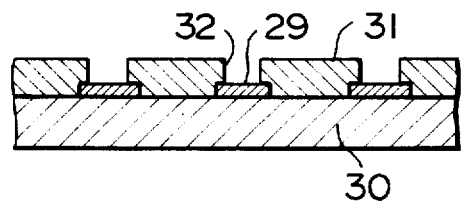
FIG. 21 is a sectional view showing a modified example of the substrate.

More specifically, in FIG. 21, a thin metal film 29 made, for example, of aluminum alloy is formed on the substrate 30, and this is partly covered to form the thin insulating film 31 on the substrate 30. The holes 32 of the thin insulating film 31 for exposing the thin metal film 29 in this case are generally called "a via hole". The second thin metal film (which may be of different metal) may be formed by the apparatus of this invention in the thin metal film 29 of the substrate 30.

It is desirable to clean the substrates in FIGS. 10 and 21 by any means for cleaning the surface of the first thin metal films 13 and 29 such as plasma cleaning.

In the embodiments described above, the thin metal film has been formed (by selective growth) only on the portion (this is generally called "contact hole") not formed with the thin insulating film in FIG. 9 or the through holes 32 of FIG. 21. However, the thin metal film may also be formed on the thin insulating film (on the entire surface growth). In this case, the conditions of the type, pressure and flow rate of the gas will be altered, but the thin metal film or thin film of metal silicide or alloy of desired thickness may be formed at higher speed than the conventional CVD apparatus.

The shape of the substrate formed with the thin film on the entire surface may be any, and may not have the abovementioned hole. In this case, the film thickness distribution of the thin metal film, the metal silicide or the thin film of the alloy may be uniformly controlled.

The substrate holder having heating means in this invention includes not only a holder provided with the heater therein as shown in FIG. 18, but heating means provided externally.

What is claimed is:

1. An apparatus for a chemical vapor deposition, comprising a pressure reduced reaction chamber having means for supporting at least one substrate; means for feeding a first gas substantially parallel to the surface of said substrate under reduced pressure in a sheet-like flow; means for feeding a second gas opposed to the surface of said substrate to put said first gas flow into a laminar flow state in the vicinity of said substrate; and means for emitting a light beam to heat said substrate in said reaction chamber; thereby producing a chemical reaction to form a thin film having the component of said first gas on said substrate.

2. An apparatus according to claim 1, wherein said substrate is formed at a portion of the surface thereof with an electrical insulating film and is formed at the other portion of the surface thereof with a first metal film, said first gas comprises a gas containing a metal element and a reducing gas, said second gas comprises an inert gas or a gas containing the inert gas as a main component, and a temperature difference is created between said electrical insulating film and said first metal film on the surface of said substrate by the difference in a light absorptivity of the body of said substrate, said electrical insulating film and said first metal film, thereby causing the chemical reaction to occur only on the surface of said first metal film so that a second metal film of said metal element is formed on the surface of the first metal film.

3. An apparatus according to claim 1, wherein said substrate is formed at a portion of the surface thereof with an electrical insulating film and is formed at the other portion of the surface of said substrate with no electrical insulating film, said first gas comprises a gas containing a metal element and/or a reducing gas, said second gas comprises an inert gas or a gas containing the inert gas as a main component, at least said gas containing the metal element is introduced into said reaction chamber under reduced pressure to form a first metal film including said metal element on the portion of the surface of said substrate formed with no electrical insulating film, and after formation of said first metal film, said gas containing the metal element and said reducing gas are introduced into said reaction chamber and said each substrate is irradiated by the light beam from said light beam emitting means to create a temperature difference between said electrical insulating film and said first metal film thus formed by the difference in a light absorptivity of the body of said substrate, the electrical insulating film and the first metal film, thereby causing the chemical reaction to occur only on the surface of said first metal film so that a second metal film is formed on the surface of the first metal film.

4. An apparatus according to claim 2 wherein the metal element which constitutes said first metal film is the same as that of said second metal film.

5. An apparatus according to claim 2 wherein the metal element which constitutes said first metal film is different from that of said second metal film.

6. An apparatus according to claim 2 wherein said reducing gas is $H_2$, and said first gas containing the metal element is any one or more metallic halides selected from the group consisting of $WF_6$, $MoF_6$, $TaF_5$, $CrF_4$, $TiF_4$, $TiCl_4$, $MoCl_5$, $MCl_6$, and $AlCl_3$.

7. An apparatus according to claim 2 wherein said electrical insulating film on the surface of the substrate is formed of any one or more oxides selected from the group consisting of $SiO_2$, $Al_2O_3$, BSG, PSG, BPSG, and nitrides selected from the group consisting of BN and $SiN_x$, and $SiN_xO_y$.

8. An apparatus according to claim 2 wherein said first metal film is formed of any one or more metals selected from the group consisting of W, Mo, Ta, Cr, Ti, Al, Pt, Pd, Au and Ni.

9. An apparatus according to claim 2 wherein said first metal film is formed of any one or more selected from the group consisting of metallic silicides, and metallic nitrides.

10. An apparatus according to claim 2 wherein said substrate is made of any one of Si, $SiO_2$, $Al_2O_3$, glass, or sapphire.

11. An apparatus according to claim 2 wherein said substrate is made of any one of Si, $SiO_2$, $Al_2O_3$, glass or sapphire, which is provided with a thin film of Si on the uppermost layer thereof.

12. An apparatus according to claim 1 wherein said light beam emitting means comprises at least one high intensity lamp which radiates heat energy at a wavelength of approximately 0.75–5 $\mu$m.

13. An apparatus according to claim 12, wherein said lamp is positioned outside of the reaction chamber, the light beam from the lamp being transmitted through a transparent window provided on the reaction chamber wall into the reaction chamber.

14. An apparatus according to claim 1, further comprising means for optically, filtering the light beam from the light beam emitting means, said filter means being interposed between the light beam emitting means and the reaction chamber wall.

15. An apparatus for a chemical vapor deposition, comprising a pressure reduced reaction chamber; means for supporting at least one substrate in said reaction chamber and having means for heating said substrate; means for feeding a first gas substantially parallel to the surface of said substrate under reduced pressure in a sheet-like flow; means for feeding a second gas opposite to the surface of said substrate to put said first gas flow into a laminar flow state in the vicinity of said substrate; and means for emitting a light beam to heat said substrate in said reaction chamber; thereby producing a chemical reaction to form a thin film having the component of said first gas on said substrate.

16. An apparatus according to claim 15, wherein said substrate is formed at a portion of the surface thereof with an electrical insulating film and is formed at the other portion of the surface thereof with a first metal film, said first gas comprises a gas containing a metal element and a reducing gas, said second gas comprises an inert gas or a gas containing the inert gas as a main component, and a temperature difference is created between said electrical insulating film and said first metal film on the surface of said substrate by the difference in a light absorptivity of the body of said substrate, said electrical insulating film and said first metal film, thereby causing the chemical reaction to occur only on the surface of said first metal film so that a second metal film of said metal element is formed on the surface of the first metal film.

17. An apparatus according to claim 15, wherein said substrate is formed at a portion of the surface thereof with an electrical insulating film and is formed at the other portion of the surface of said substrate no electrical insulating film, said first gas comprises a gas containing a metal element and/or a reducing gas, said second gas comprises an inert gas or a gas containing the inert gas as a main component, at least said gas containing the metal element is introduced into said reaction chamber under reduced pressure to form a first metal film including said metal element on the portion of the surface of said substrate formed with no electrical insulating film, and after formation of said first metal film, said gas containing the metal element and said reducing gas are introduced into said reaction chamber and said each substrate is irradiated by the light beam from said light beam emitting means to create a temperature difference between said electrical insulating film and said first metal film thus formed by the difference in a light absorptivity of the body of said substrate, the electrical insulating film and the first metal film, thereby causing the chemical reaction to occur only on the surface of said first metal film so that a second metal film is formed on the surface of the first metal film.

18. An apparatus according to claim 16, wherein the metal element which constitutes said first metal film is the same as that of said second metal film.

19. An apparatus according to claim 16, wherein the metal element which constitutes said first metal film is different from that of said second metal film.

20. An apparatus according to claim 16 wherein said reducing gas is $H_2$, and said first gas containing the metal element is any one or more metallic halides selected from the group consisting of $WF_6$, $MoF_6$, $TaF_5$, $CrF_4$, $TiF_4$, $TiCl_4$, $MoCl_5$, $WCl_6$, and $AlCl_3$.

21. An apparatus according to claim 16 wherein said electrical insulating film on the surface of the substrate is formed of any one or more oxides selected from the group consisting of $SiO_2$, $Al_2O_3$, BSG, PSG, and BPSG, nitrides selected from the group consisting of BN and $SiN_x$ and $SiN_xO_y$.

22. An apparatus according to claim 16 wherein said first metal film is formed of any one or more metals selected from the group consisting of W, Mo, Ta, Cr, Ti, Al, Pt, Pd, Au, and Ni.

23. An apparatus according to claim 16 wherein said first metal film is formed of any one or more metallic silicides selected from the group consisting of $WSi_x$, $TiSi_x$, $TaSi_x$, $MoSi_x$ and $PtSi_x$, and TiN.

24. An apparatus according to claim 16 wherein said each substrate is made of Si, $SiO_2$, $Al_2O_3$, glass or sapphire.

25. An apparatus according to claim 17 wherein said substrate is made of Si, $SiO_2$, $Al_2O_3$, glass or sapphire, which is provided with a thin film of Si on the uppermost layer thereof.

26. An apparatus according to claim 15, wherein said light beam emitting means comprises at least one high intensity lamp which radiates heat energy at a wavelength of approximately 0.75–5$\mu$m.

27. An apparatus according to claim 26, wherein said lamp is positioned outside of the reaction chamber, the light beam from the lamp being transmitted through a transparent window provided on the reaction chamber wall into the reaction chamber.

28. An apparatus according to claim 15, further comprising means for optically filtering the light beam from the light beam emitting means, said filtering means being interposed between the light beam emitting means and the reaction chamber wall.

* * * * *